United States Patent
Zhu

(10) Patent No.: US 10,074,753 B2
(45) Date of Patent: Sep. 11, 2018

(54) CONDUCTIVITY ENHANCEMENT OF SOLAR CELLS

(71) Applicant: SUNPOWER CORPORATION, San Jose, CA (US)

(72) Inventor: Xi Zhu, Milpitas, CA (US)

(73) Assignee: SunPower Corporation, San Jose, CA (US)

( * ) Notice: Subject to any disclaimer, the term of this patent is extended or adjusted under 35 U.S.C. 154(b) by 746 days.

(21) Appl. No.: 14/211,353

(22) Filed: Mar. 14, 2014

(65) Prior Publication Data

US 2014/0261671 A1    Sep. 18, 2014

Related U.S. Application Data

(60) Provisional application No. 61/800,188, filed on Mar. 15, 2013.

(51) Int. Cl.
    *H01L 31/0224*    (2006.01)
    *H01L 31/068*     (2012.01)
    *H01L 31/18*      (2006.01)

(52) U.S. Cl.
    CPC ........... *H01L 31/022425* (2013.01); *H01L 31/022441* (2013.01); *H01L 31/0682* (2013.01);
    (Continued)

(58) Field of Classification Search
    CPC .............. H01L 31/022425; Y02E 10/50
    See application file for complete search history.

(56) References Cited

U.S. PATENT DOCUMENTS 5,011,565 A * 4/1991 Dube ............. H01L 31/022425
                                                                         136/256
5,468,652 A   11/1995 Gee
(Continued)

FOREIGN PATENT DOCUMENTS

CN    101764180 A    6/2010
EP        2284907    2/2011
(Continued)

OTHER PUBLICATIONS

International Search Report and Written Opinion for International Application No. PCT/US2014/029644 dated Jul. 17, 2014, 15 pages.

(Continued)

*Primary Examiner* — Michelle Mandala
(74) *Attorney, Agent, or Firm* — Schwabe, Williamson & Wyatt, P.C.

(57) ABSTRACT

Methods and structures for forming a contact region on a solar cell are presented. The solar cell can have a front side which faces the sun during normal operation, and a back side opposite the front side and a silicon substrate. The silicon substrate can include at least one doped region a dielectric layer formed over the doped region. The solar cell can also include a first metal contact, such as an electrolessly plated metal contact, within a contact region through a first dielectric layer and on the doped region. The solar cell can include a printed metal, such as aluminum, formed or deposited on the first metal contact. The solar cell can include a first metal layer having a first metal contact and the first printed metal. The solar cell can include a second metal layer, such as an electrolytically electroplated metal layer, formed on the first metal layer.

15 Claims, 13 Drawing Sheets

(52) U.S. Cl.
CPC ........ *H01L 31/1804* (2013.01); *Y02E 10/547* (2013.01); *Y02P 70/521* (2015.11)

(56) References Cited

U.S. PATENT DOCUMENTS

| | | | |
|---|---|---|---|
| 7,339,110 | B1 | 3/2008 | Mulligan et al. |
| 7,633,006 | B1 | 12/2009 | Swanson |
| 2003/0172969 | A1 | 9/2003 | Jenson et al. |
| 2006/0060238 | A1 | 3/2006 | Hacke et al. |
| 2007/0148336 | A1 | 6/2007 | Bachrach et al. |
| 2008/0128268 | A1 | 6/2008 | Lopatin et al. |
| 2008/0210301 | A1* | 9/2008 | Mulligan ........ H01L 31/022441 136/256 |
| 2009/0139568 | A1 | 6/2009 | Weidman et al. |
| 2009/0239331 | A1 | 9/2009 | Xu et al. |
| 2010/0032011 | A1 | 2/2010 | Sauar |
| 2010/0124619 | A1 | 5/2010 | Xu et al. |
| 2011/0114179 | A1 | 5/2011 | Funakoshi |
| 2011/0192316 | A1 | 8/2011 | Chou |
| 2011/0195542 | A1 | 8/2011 | Chou et al. |
| 2014/0174518 | A1* | 6/2014 | Wu ................. H01L 31/022425 136/256 |

FOREIGN PATENT DOCUMENTS

| | | |
|---|---|---|
| EP | 2479802 | 7/2012 |
| JP | S5426675 A | 2/1979 |
| JP | 2008512858 A | 4/2008 |
| JP | 2009290105 | 12/2009 |
| JP | 2012060123 | 3/2012 |
| JP | 2012216646 | 11/2012 |
| KR | 101198870 | 11/2012 |

OTHER PUBLICATIONS

International Preliminary Report on Patentability from PCT/US2014/029644 dated Sep. 24, 2015, 12 pgs.

First Office Action for Chinese Patent Application No. 201480015814.0 dated Aug. 22, 2016, 22 pgs., with English translation.

European Search Report and Search Opinion from EP 14763695.5 dated Mar. 16, 2016, 7 pgs.

Non-Final Office Action for Mexico Patent Application No. MX/a/2015/013100 dated Nov. 17, 2016, 5 pgs., with English translation.

Second Office Action for Chinese Patent Application No. 201480015814.0 dated Mar. 30, 2017, 10 pgs., with English translation.

"Principles and Technology of Photovoltaic Cells", Excerpts from the Chinese book, p. 201, line 8-9, English translation with Mar. 30, 2017, second office action, 4 pgs.

Examination Report No. 1 from Australian Patent Application No. 2014233487 dated Jul. 22, 2017, 3 pgs.

Non-Final Notice of Reasons for Rejection from Japanese Patent Application No. 2016-503178 dated Jan. 30, 2018, 6 pgs.

Examination Report 4 from Australian Patent Application No. 2014233487, dated Mar. 13, 2018, 3 pgs.

P212139 Buried Contract Solar Cells_PVEducation, Wayback Machine, report from May 20, 2012, viewed on the internet Feb. 13, 2018, 2 pgs.

Third Written Opinion from Intellectual Property Office of Singapore for Singapore Patent Application No. 11201507008U, dated May 2, 2018, 5 pgs.

Decision of Rejection for Chinese Patent Application No. 2014800158140, dated May 4, 2018; 9 pgs.

\* cited by examiner

CONDUCTIVITY ENHANCEMENT OF SOLAR CELLS

CROSS REFERENCE TO RELATED APPLICATIONS

This application claims the benefit of U.S. Provisional Application No. 61/800,188 filed Mar. 15, 2013, entitled "METHODS AND STRUCTURES FOR CONDUCTIVITY ENHANCEMENT OF SOLAR CELLS", the entire contents of which are hereby incorporated by reference.

BACKGROUND

Photovoltaic (PV) cells, commonly known as solar cells, are well known devices for conversion of solar radiation into electrical energy. Generally, solar radiation impinging on the surface of, and entering into, the substrate of a solar cell creates electron and hole pairs in the bulk of the substrate. The electron and hole pairs migrate to p-doped and n-doped regions in the substrate, thereby creating a voltage differential between the doped regions. The doped regions are connected to the conductive regions on the solar cell to direct an electrical current from the cell to an external circuit. When PV cells are combined in an array such as a PV module, the electrical energy collected from all of the PV cells can be combined in series and parallel arrangements to provide power with a certain voltage and current.

The disclosed techniques and structures for contact formation may reduce fabrication operations and improve overall output yield, decreasing overall solar cell manufacturing time and increasing the available product yield.

DETAILED DESCRIPTION

Figure 1:
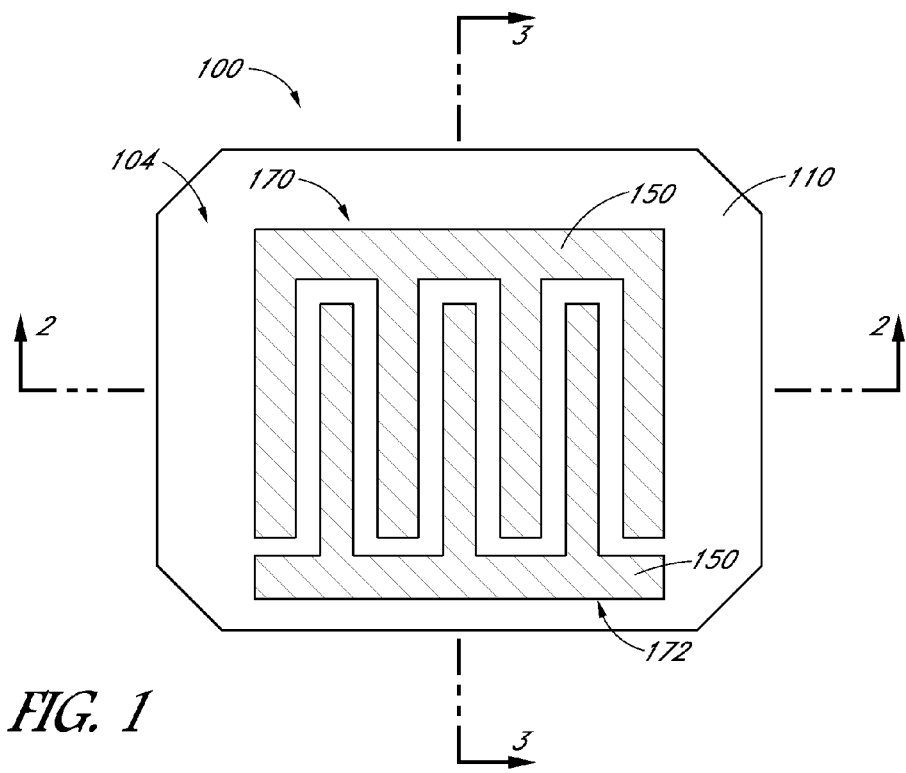
FIG. 1 illustrates a schematic plan view of an example solar cell, according to some embodiments.

The following detailed description is merely illustrative in nature and is not intended to limit the embodiments of the subject matter of the application or uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" dielectric does not necessarily imply that this dielectric is the first dielectric in a sequence; instead the term "first" is used to differentiate this dielectric from another dielectric (e.g., a "second" dielectric).

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

"Layer." As used herein, layer can be a continuous region, or layer can have holes or gaps such that it is not continuous.

As described below, the solar cell can have a silicon substrate. The silicon substrate can be cleaned, polished, planarized, and/or thinned or otherwise processed prior to the formation of first and second doped regions. In an embodiment, the silicon substrate can be polysilicon or multi-crystalline silicon.

As described herein, the solar cell can include first and second doped regions. In an embodiment, the first and second doped regions can be grown by a thermal process. In some embodiments, the first and second doped regions can be formed by depositing dopants in the silicon substrate by a conventional doping process. The first and second doped regions can each include a doping material but is not limited to a positive-type dopant such as boron and a negative-type dopant such as phosphorous. Although both the first and second doped regions are described as being grown through a thermal process, as with any other formation, deposition, or growth process operation described or recited here, each layer or substance is formed using any appropriate process. For example, a chemical vapor deposition (CVD) process, low-pressure CVD (LPCVD), atmospheric pressure CVD (APCVD), plasma-enhanced CVD (PECVD), thermal growth, sputtering, as well as any other desired technique is used where formation is described. Thus, and similarly, the first and second doped regions can be formed on the silicon substrate by a deposition technique, sputter, or print process, such as inkjet printing or screen printing. In an embodiment, an oxide layer can deposited over the first and second doped regions serving as a protective barrier for both regions.

As described below, the solar cell can include a dielectric layer formed over the doped regions, and forming contact openings through the dielectric layer. In an embodiment, the contact openings are formed by any number of lithography processes including wet-etching and ablation techniques (e.g., laser ablation, etc.).

As used herein, the solar cell can include a texturized surface on the silicon substrate, where a dielectric layer can be formed over the texturized surface. The texturized surface can be one which has a regular or irregular shaped surface for scattering incoming light, decreasing the amount of light reflected back off the surface the solar cell. In an embodiment, a dielectric layer can be an anti-reflective coating (ARC) or a back anti-reflective coating (BARC) formed on either a front or back side of a solar cell. In an embodiment, the dielectric layer can be silicon nitride.

As described below, the solar cell can be, but not limited to, a back-contact solar cell, a front-contact solar cell, a monocrystalline silicon solar cell, a polycrystalline silicon solar cell and an amorphous silicon solar cell.

In the following description, numerous specific details are set forth, such as specific operations, in order to provide a thorough understanding of embodiments of the present disclosure. It will be apparent to one skilled in the art that embodiments of the present disclosure may be practiced without these specific details. In other instances, well-known techniques are not described in detail in order to not unnecessarily obscure embodiments of the present disclosure.

This specification first describes example solar cells that can include the disclosed contact regions, followed by a description of an example method for forming the disclosed contacts regions. A more detailed explanation of various embodiments of contact regions are provided throughout.

Figure 2:
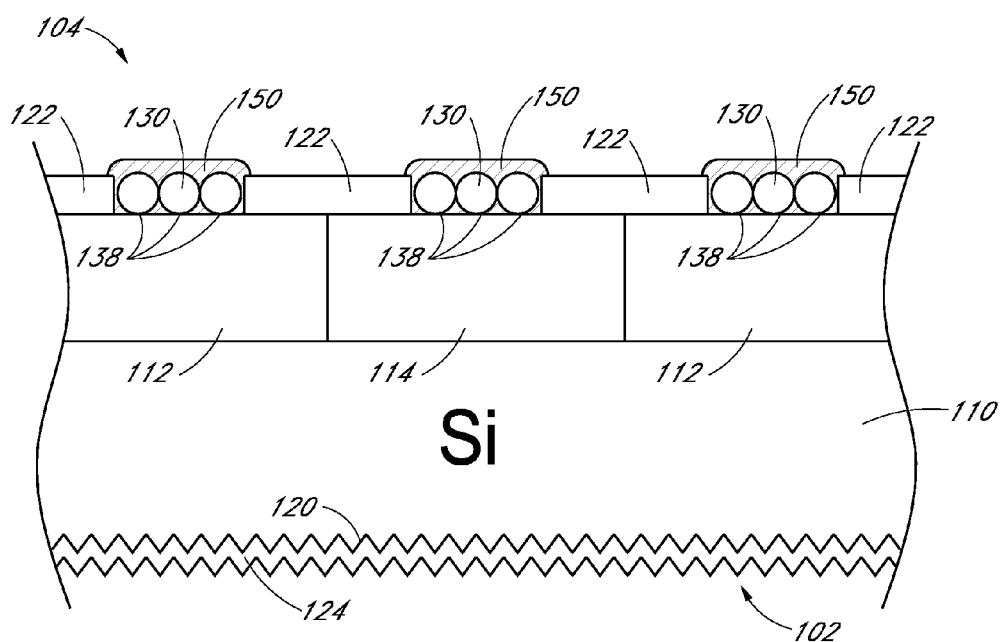
FIGS. 2 and 3 illustrate a cross-sectional view of an example solar cell, according to some embodiments.
Figure 3:
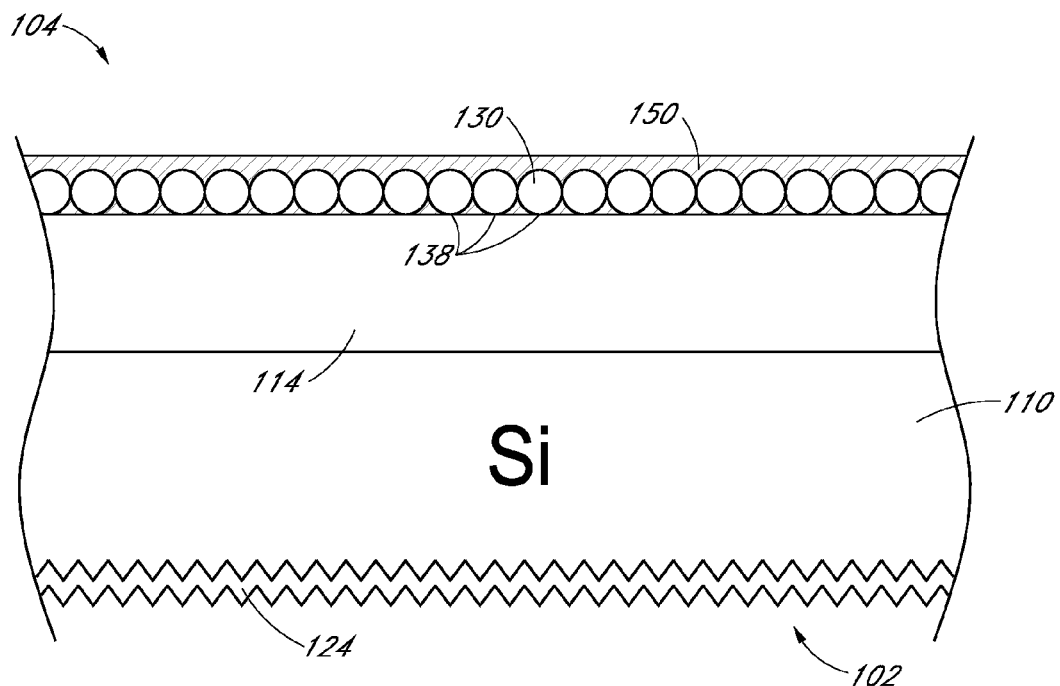

Turning now to FIG. 1, a schematic plan view of an example solar cell 100 is illustrated. A back side 104 of a solar cell opposite to a front side, as described in FIG. 2 below, is shown. The solar cell can include a silicon substrate 110. The solar cell can also include a metal layer 150 formed on the silicon substrate 110. The metal layer 150 can include a first and second busbar region 170, 172. Cross sectional lines 2, 3 are shown. FIG. 2 represents a cross-section view of the solar cell 100 across the cross sectional line 2. FIG. 3 represents a cross-section view of the solar cell 100 across the cross sectional line 3.

With reference to FIG. 2, a cross-section view of solar cell of FIG. 1 is shown. The solar cell, as shown, can include a front side 102 which faces the sun during normal operation and a back side 104 opposite the front side 102. The solar cell can include a silicon substrate 110 and first and second doped regions 112, 114. The solar cell can also include a first dielectric layer 122. The solar cell can also include contact regions formed through the first dielectric layer 122. The solar cell can include a first metal layer 130. In some embodiments, the first metal layer can be formed by a printing technique (e.g., screen printing). In an embodiment, the first metal layer 130 can include metal particles, where the metal particles can be formed on the contact regions contacting the first and second doped regions 112, 114 at contact locations 138. In an embodiment, the first metal layer 130 can be formed through a print process, such as through screen printing. In an embodiment, the first metal layer can be a printed metal. Texturized regions 120 can be formed on the silicon substrate 110, where texturized regions 120 provide additional light absorption. A second dielectric layer 124 can be formed on the texturized regions. As shown, the contact regions over different doped regions are separate.

FIG. 3 illustrates another cross-section view of the solar cell of FIG. 1. As shown, the first metal layer 130 and second metal layer 150 can be continuously disposed on the second doped region 114. Although not shown, the first and second metal layer 130, 150 can also be continuously disposed on the first doped region 112.

FIGS. 1-3 above show some example solar cell contact regions. The porosity of printed metal, such as of the first metal layer 130 shown above, can increase the contact resistance of a solar cell. Increased contact resistance can be detrimental to the lifetime of charge carriers of the solar cell, degrading the overall solar cell performance. A low contact resistance is required to maximize the current flow of the solar cell. FIGS. 4-12 illustrate various structures corresponding to steps of one or more methods for forming a contact region on a solar cell. One or more methods are directed to overcoming the limitations discussed above. Details and embodiments are discussed below.

Figure 4:
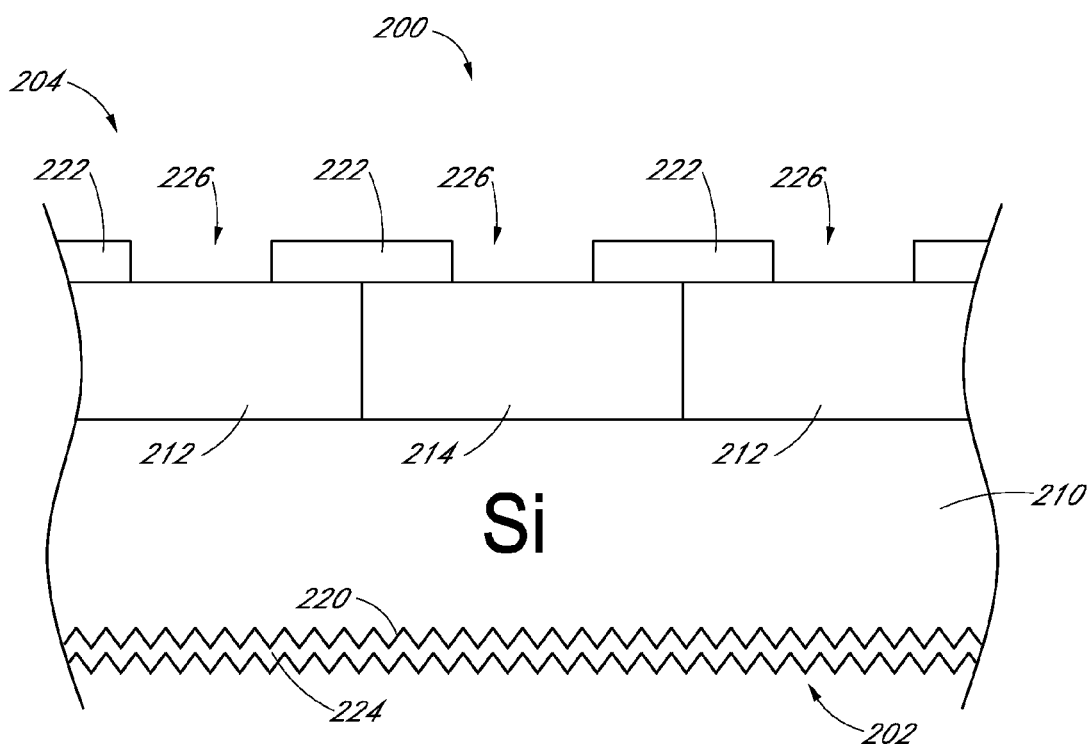
FIGS. 4-12 illustrate cross-sectional views of various operations in forming a contact region on a solar cell, according to some embodiments.

Turning to FIG. 4, there is shown a step in a method for forming a contact region for a solar cell 200. The method can include providing a solar cell 200 having a front side 202 which faces the sun during normal operation and a back side 204 opposite the front side 202. The solar cell 200 can include a silicon substrate 210 and first and second doped regions 212, 214. The solar cell can also include a first dielectric layer 222. The solar cell can also include contact regions 226 formed through the first dielectric layer 222. Texturized regions 220 can be formed on the silicon substrate 210. A second dielectric layer 224 can be formed on the texturized regions.

Figure 5:
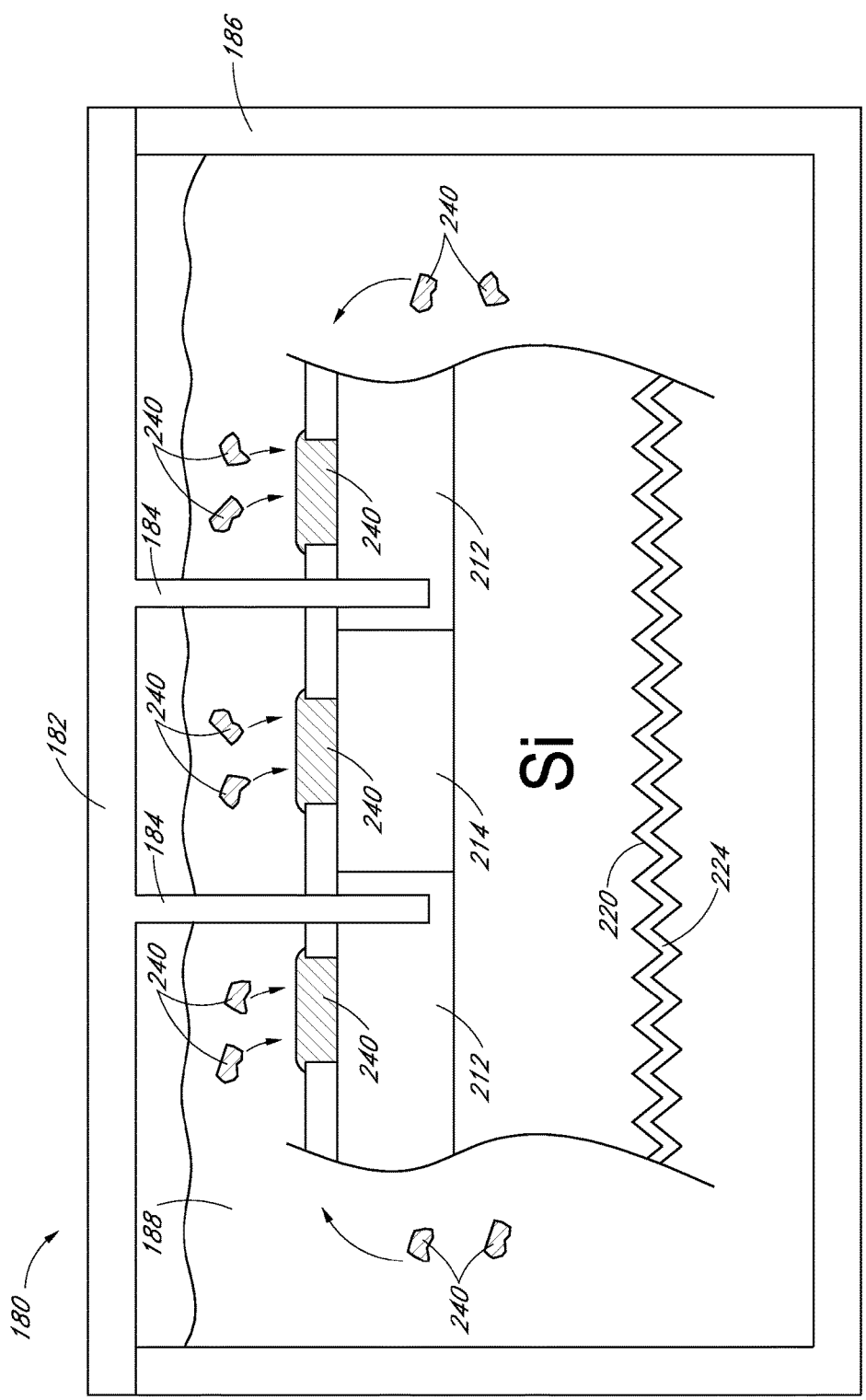

With reference to FIG. 5, a step in a method for forming a contact region for a solar cell 200 is shown. The method can include providing an electroless plating setup 180. The electroless plating setup 180 can include the solar cell 200 immersed in an electroless plating medium 188 within a plating tank 186. The solar cell 200 can be suspended by a holder 182 and a plurality of fixtures 184. An auto-catalytic reaction (e.g., electroless plating) can be induced within the electroless plating medium 188 to deposit a metal 240 over the contact region 226 of FIG. 4 forming a first metal contact 240. In an embodiment, the method can include electrolessly plating a metal 240 selected from the group consisting of nickel, gold, silver, rhodium, chromium, zinc, tin and cadmium. In an embodiment, the method can include electroless nickel plating to plate nickel to the contact region 226 of FIG. 4.

Figure 6:
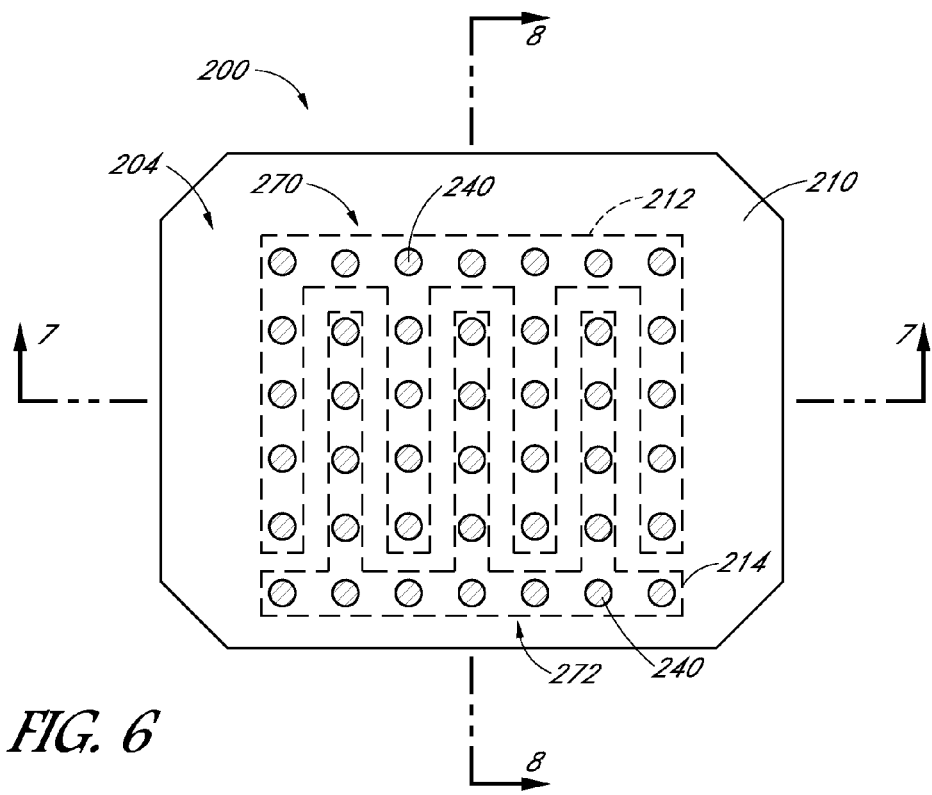
Figure 7:
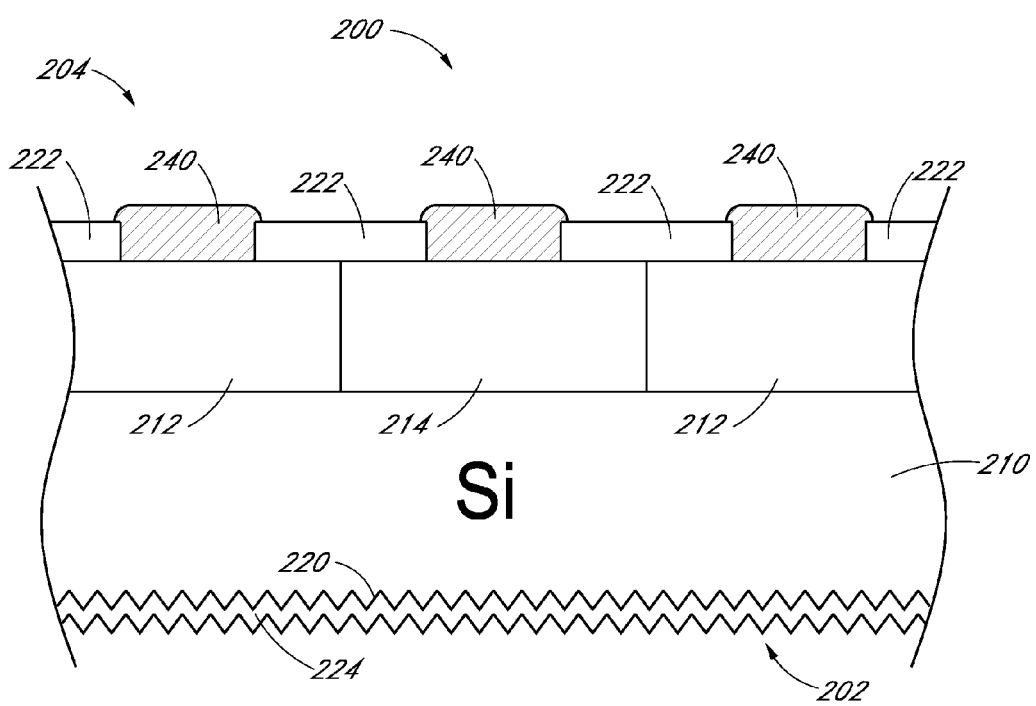
Figure 8:
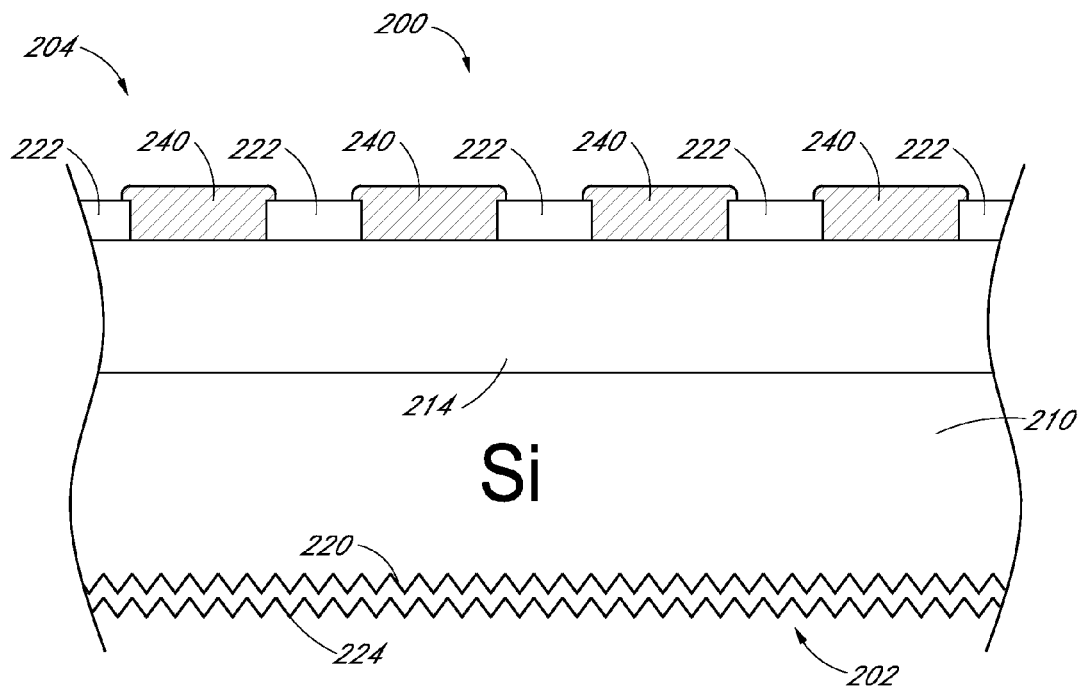

FIG. 6 illustrates a schematic plan view of an example solar cell of FIG. 5. A back side 204 of the solar cell 200 is shown. Illustrated are the silicon substrate 210, first metal contact 240 formed on the silicon substrate 210. The first and second doped regions 212, 214 are also shown. In an embodiment, the first and second doped regions can be formed in an interdigitated pattern as illustrated. The first metal contact 240 can include a first and second busbar region 270, 272. Cross sectional lines 7, 8 are shown. FIG. 7 represents a cross-section view of the solar cell of FIG. 5 across the cross sectional line 7. FIG. 8 represents a cross-section view of the solar cell 200 of FIG. 5 across the cross sectional line 8.

With reference to FIG. 7, a cross-section view of solar cell of FIG. 6 is shown. As shown, the solar cell 200 can include a first metal contact 240 formed over the first and second doped regions 212, 214. As shown, the first metal contact 240 formed over different doped regions are separated (e.g., not non-continuous or not connected).

FIG. 8 illustrates another cross-section view of the solar cell of FIG. 6. As described above, FIG. 8 represents the cross-section view of the solar cell across the cross sectional line 8. As shown, the first metal contact 240 can be separated (e.g., not continuous or not connected) forming point contacts. In an embodiment, point contacts provide low contact resistance. In some embodiments, the point contacts can lower the cost for the formation of the first metal contact 240 (e.g., less material needed to manufacture point as compared to the line contacts seen in FIGS. 1-3, point contacts have less area in comparison to line contacts).

Figure 9:
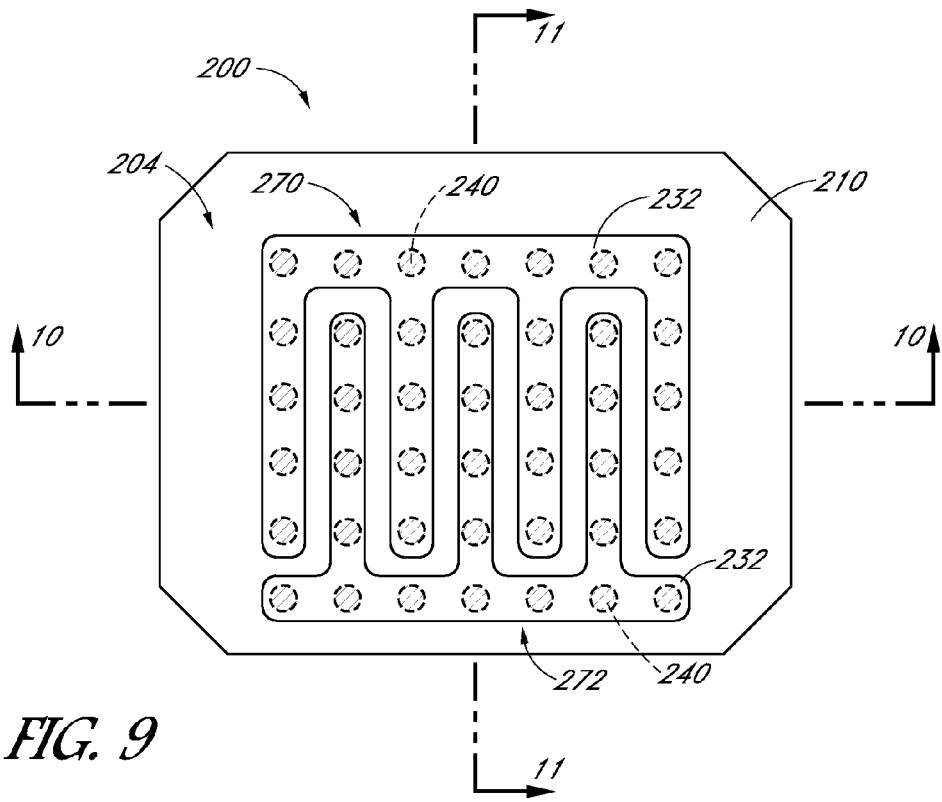
Figure 10:
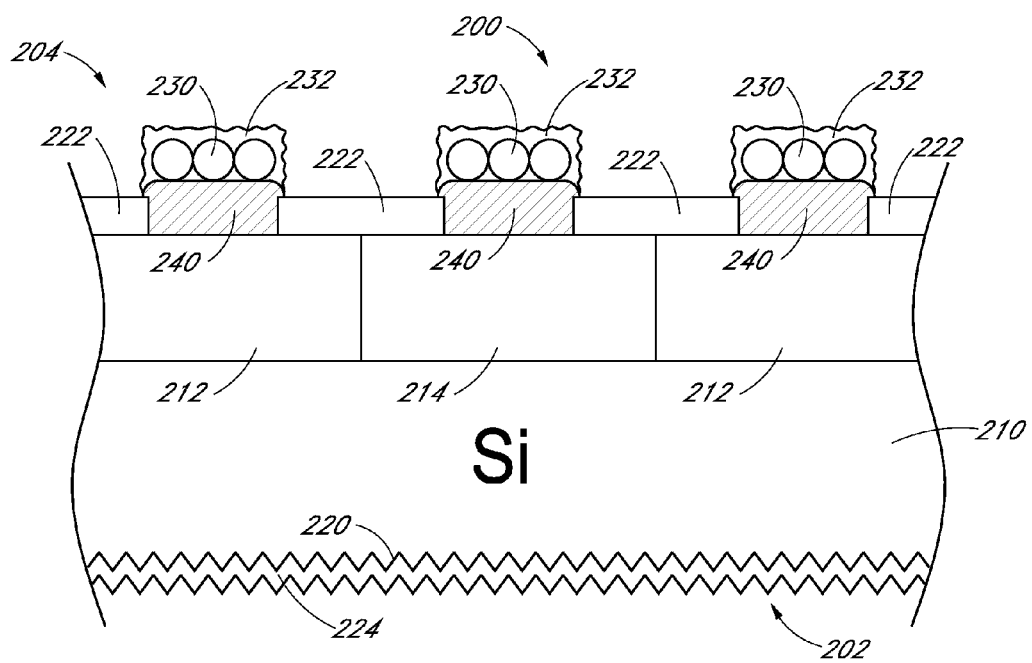
Figure 11:
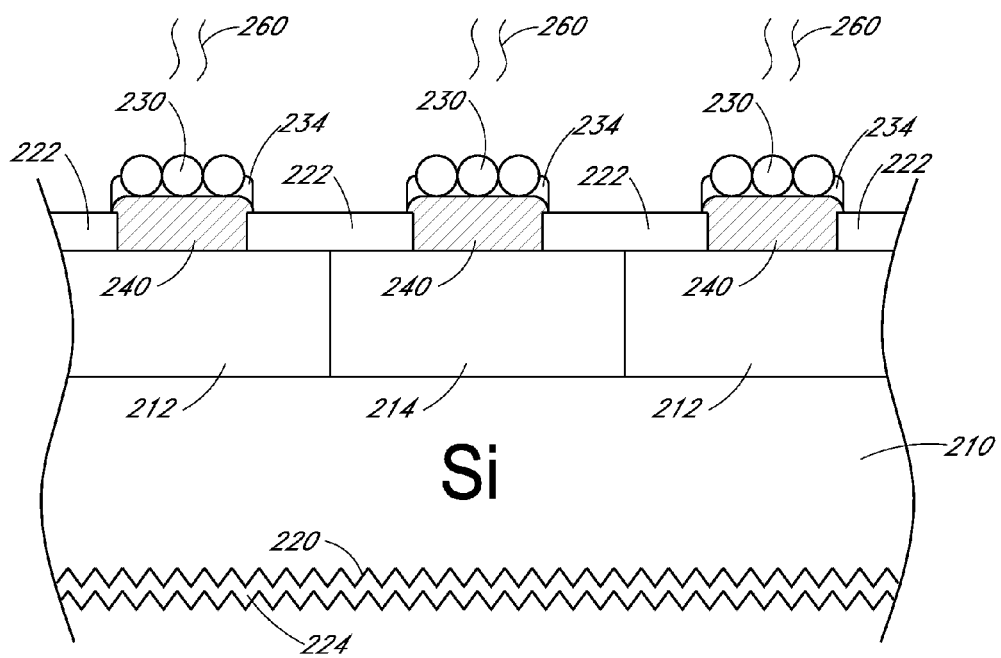

FIG. 9 illustrates a schematic plan view of an example solar cell of FIGS. 5-8 subsequent to the formation of a first metal paste 232. The first metal paste 232 can be formed in an interdigitated pattern as illustrated. Cross sectional lines 10, 11 are also shown. FIG. 10 represents a cross-section view of the solar cell 200 across the cross sectional line 10. FIG. 11 represents a cross-section view of the solar cell 200 across the cross sectional line 11.

With reference to FIG. 10, another step in a method for forming a contact region for a solar cell is shown, according to some embodiments. The method can include forming a first metal paste 232 having a printed metal, or metal particles, over the first metal contact 240. In an embodiment, the printed metal can be aluminum. In an embodiment, the first metal paste 232 can be an aluminum paste. In some embodiments, the printed metal can be aluminum particles. In an embodiment, the first metal paste can be deposited by a printing technique. In some embodiments, the first metal paste can be deposited by inkjet printing or screen printing. In an embodiment, the metal paste comprises depositing an aluminum paste. In an embodiment, the first metal paste (e.g., aluminum paste) can be formed with a thickness of at least 0.5 microns.

FIG. 11 illustrates still another step in a method for forming a contact region for a solar cell. The method can include heating 260 the first metal paste 232, where the heating removes a cohesive matrix 234 which can hold the printed metal together as required for dispensing. In an embodiment, the curing 260 forms a first metal layer 230 from the first metal paste 232, where the first metal layer 230 can include printed metal or metal particles. In still another embodiment, the first metal contact can be annealed. In still another embodiment, the method includes using an annealing temperature at least equal to 550° C.

Figure 12:
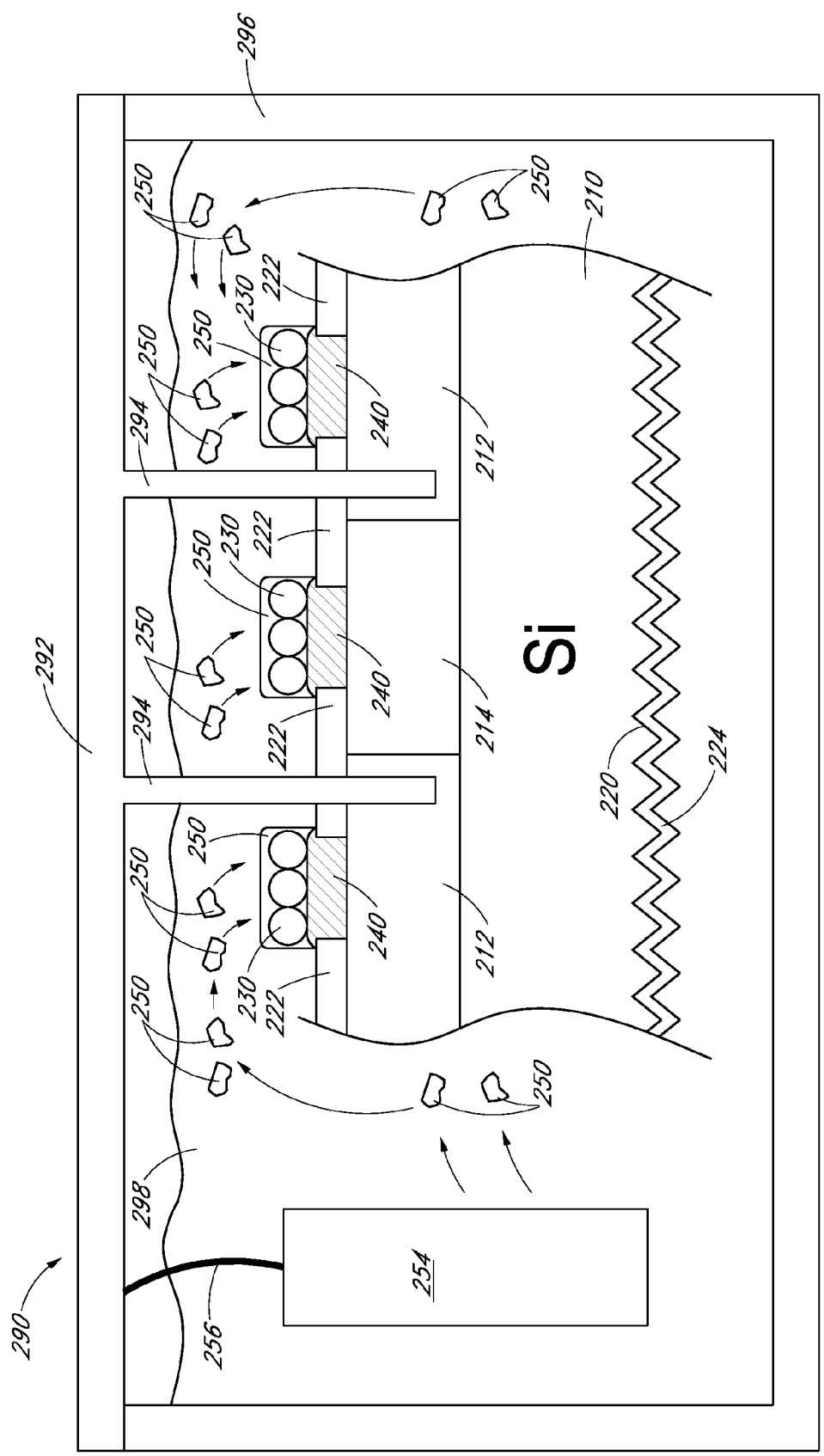

With reference to FIG. 12, yet another step in a method for forming a contact region for a solar cell is shown. The method can include providing an electrolytic plating setup 290 including a solar cell immersed in an electrolytic plating medium 298 within a plating tank 296. The method can include suspending the solar cell by a holder 292 and a plurality of fixtures 294 similar to the above. The method can include providing an anode 254 connected to an external power supply by a wire or an interconnect 256. The method can include inducing a current, provided by the anode 254 coupled with the external power supply, within the electrolytic plating medium 298, which may allow for the flow of electrons within the medium and further allow for electrolytic plating of a metal such as, but not limited to, copper, tin, aluminum, silver, gold, chromium, iron, nickel, zinc, ruthenium, palladium, and platinum. In an embodiment, the method can include performing an electrolytic plating process to form a second metal layer 250 on the first metal layer 230 of the solar cell 200. In an embodiment, the method can further include electrolyticly plating a third metal layer to the second metal layer 250 using the same electrolytic plating setup 290 and methods mentioned above.

Figure 13:
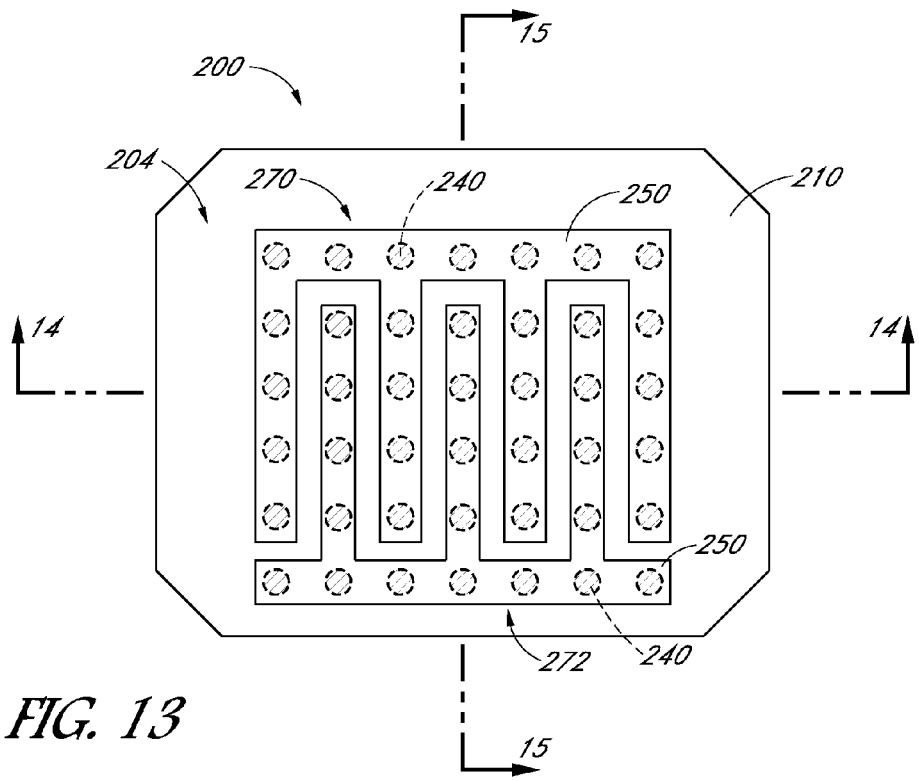
FIG. 13 illustrates a schematic plan view of another example solar cell, according to some embodiments.
Figure 14:
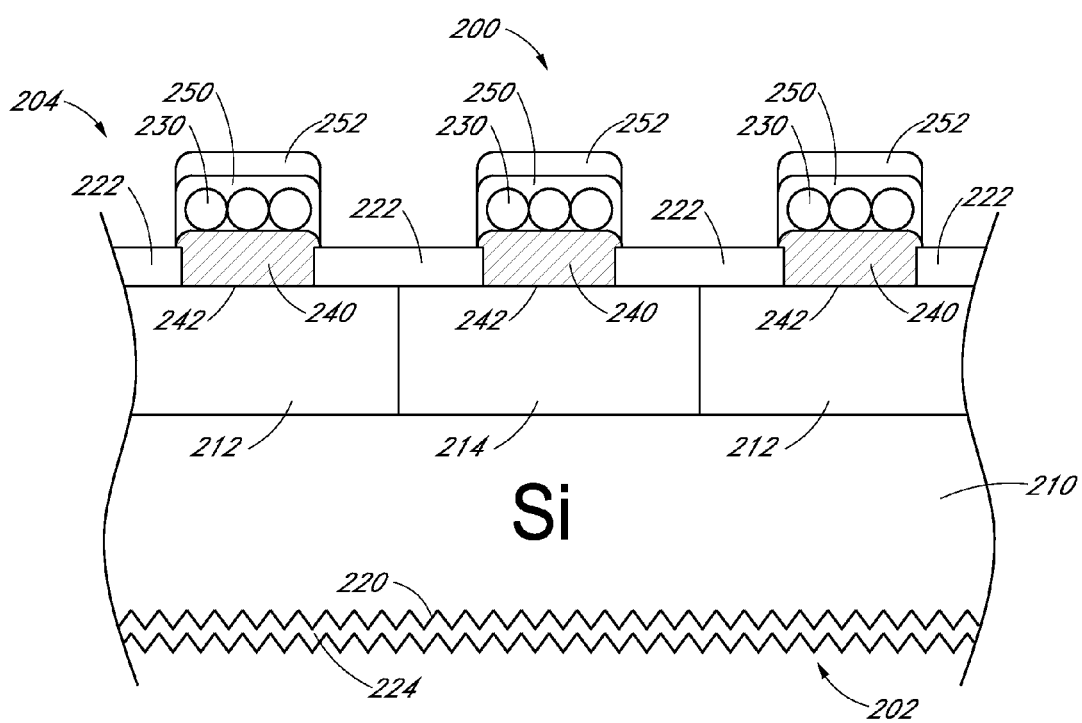
FIGS. 14-17 illustrate cross-sectional views of various example solar cells, according to some embodiments.
Figure 15:
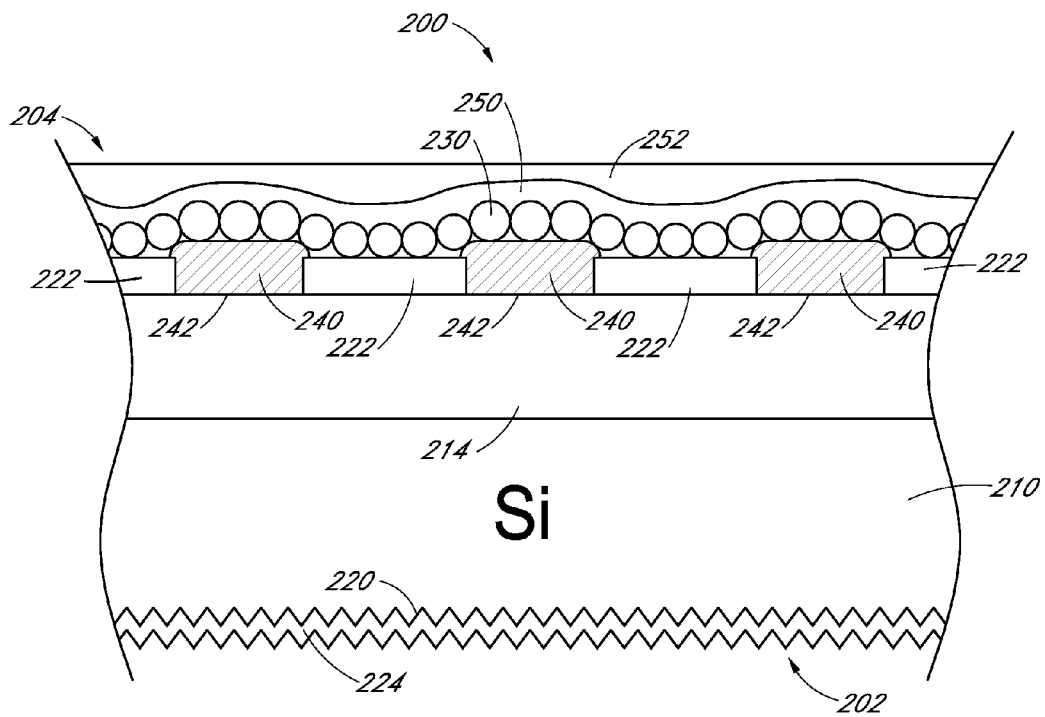

FIG. 13 illustrates a schematic plan view of the solar cell subsequent to the methods of FIGS. 4-12. As illustrated, the second metal layer metal 250 can be formed in an interdigitated pattern. Cross sectional lines 14, 15 are also shown. FIG. 14 represents a cross-section view of the solar cell 200 across line 14. FIG. 15 represents a cross-section view of the solar cell 200 across line 15.

With reference to FIG. 14, a cross-section view of a solar cell of FIG. 13 is shown. As shown, the solar cell 200 can include a first metal contact 240 formed over the first and second doped regions 212, 214. In an embodiment, the first metal contact 240 is in electrical connection 242 with the first and second doped regions 212, 214. As described above, the first metal layer 230 can be formed over the first metal contact 240. The second metal layer 250 can be formed over the first metal layer 230. In an embodiment, a third metal layer 252 can be formed over the second metal layer 250. In some embodiments, a third metal layer 252 need not be formed. As shown, the first metal contact 240 can be separate (e.g., not physically or electrically connected, non-continuous) between different contact openings and/or doped regions.

FIG. 15 illustrates a cross-section view of the solar cell of FIG. 13. As shown, the first metal contact 240 can be separate (e.g., not physically or electrically connected, non-continuous) between different contact openings and/or doped regions. In an embodiment, the first metal contact forms point contacts. As illustrated, the first, second and third metal layers 230, 250, 252 can be continuous, e.g., electrically connecting contact openings, doped regions and/or metal contacts 240. In some embodiments, at least two contact openings, doped regions and/or metal contacts 240 can be electrically connected. In some embodiments, a third metal layer 252 need not be formed.

Figure 16:
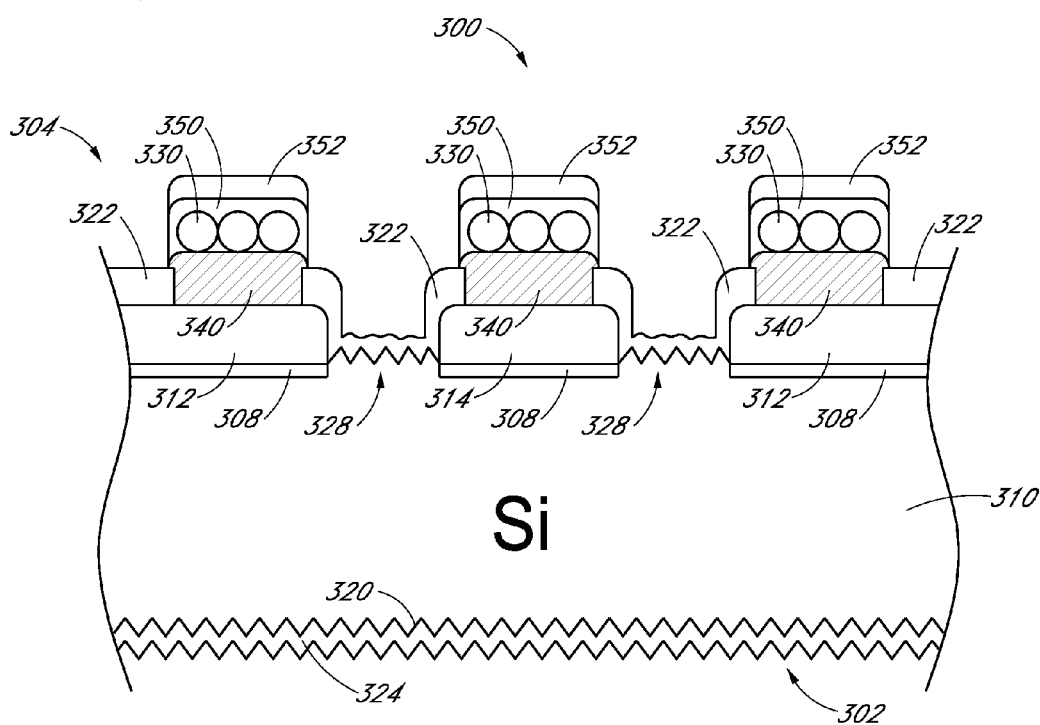

FIG. 16 illustrates another solar cell 300, according to some embodiments. As shown, the solar cell 300 can include a front side 302 which faces the sun during normal operation and a back side 304 opposite the front side 302. The solar cell 300 can include a silicon substrate 310 having first and second doped polysilicon regions 312, 314. In an embodiment, the first and second doped polysilicon regions 312, 314 can be grown by a thermal process. In some embodiments, a tunnel oxide region 308 can be formed between the first and second doped polysilicon regions and the silicon substrate 310. The first and second doped polysilicon regions 312, 314 can each include a doping material but is not limited to a positive-type dopant such as boron and a negative-type dopant such as phosphorous. A first dielectric layer 322 can be formed over the first and second doped polysilicon regions 312, 314. The solar cell 300 can also include a texturized surface 320 for additional light absorption and a second dielectric layer 324 formed over the texturized surface 320. In an embodiment, the first and second dielectric region can include silicon nitride. In an embodiment, a trench region 328 can separate contact regions. In an embodiment, the trench region 328 separates contact regions of different polarity. In some embodiments, the trench region can be texturized as shown for additional light absorption from the back side of the solar cell.

In an embodiment, contact regions formed on the solar cell 300 can include a first metal contact 340, a first metal layer 330, a second metal layer 350 and a third metal layer 352. In an embodiment, the first metal contact 340 can be formed over the first and second doped regions 312, 314. In an embodiment, the first metal contact can be formed by electroless plating. In an embodiment, the first metal contact 340 form point contacts. The first metal layer 330 can be formed over the first metal contact 340. In an embodiment, the first metal layer can be formed by depositing and curing a first metal paste having a printed metal. In some embodiments, the printed metal can be aluminum. The second metal layer 350 can be formed over the first metal layer 330. The third metal layer 352 can be formed over the second metal layer 350. In an embodiment, the second and third metal layer 350, 352 can be formed by electrolytic plating. In some embodiments, a third metal layer 352 need not be formed.

In an embodiment, the solar cells shown in FIG. 15 can be back contact solar cells. Although a particular front contact solar cell structure is shown, various other front contact solar cell structures exist, where the said methods described above are applicable and are not limited to the above structures and methods mentioned wherein.

Figure 17:
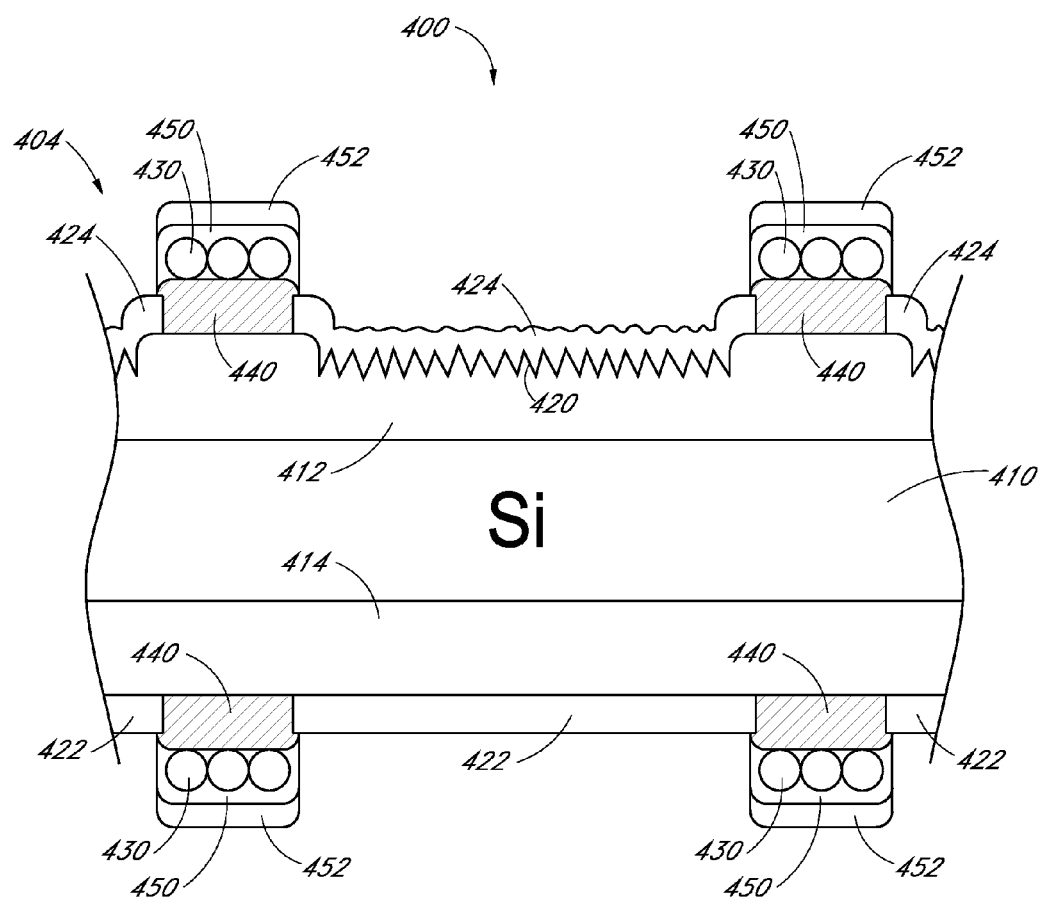

With reference to FIG. 17 front contact solar cell 400 is illustrated, according to some embodiments. As shown, the solar cell 400 can include a front side 402 which faces the sun during normal operation and a back side 404 opposite the front side 402. The solar cell 400 can include a silicon substrate 310 having first and second doped regions 412, 414. In an embodiment, the first and second doped polysilicon regions 412, 414 can be grown by a thermal process. In some embodiments, a tunnel oxide region 408 can be formed between the first and second doped regions 412, 414 and the silicon substrate 410. The first and second doped regions 412, 414 can each include a doping material but is not limited to a positive-type dopant such as boron and a negative-type dopant such as phosphorous. A first dielectric layer 424 can be formed over the first doped regions 412. A second dielectric layer 422 can be formed over the second doped regions 414. The solar cell 400 can also include a texturized surface 420 for additional light absorption and a second dielectric layer 424 formed over the texturized surface 420. In an embodiment, the first and second dielectric region can include silicon nitride.

In an embodiment, contact regions formed on the solar cell 400 can include a first metal contact 440, a first metal layer 430, a second metal layer 450 and a third metal layer 452. In an embodiment, the first metal contact 340 can be formed over the first and second doped regions 412, 414. In an embodiment, the first metal contact 440 can be formed by electroless plating. In an embodiment, the first metal contacts 440 can be point contacts. The first metal layer 430 can be formed over the first metal contact 440. In an embodiment, the first metal layer 430 can be formed by depositing and curing a first metal paste having a printed metal. In some embodiments, the printed metal can be aluminum. The second metal layer 450 can be formed over the first metal layer 430. The third metal layer 452 can be formed over the second metal layer 450. In an embodiment, the second and third metal layer 450, 452 can be formed by electrolytic plating. In some embodiments, a third metal layer 452 need not be formed.

Although a particular front contact solar cell structure is shown, various other front contact solar cell structures exist, where the said methods described above are applicable and are not limited to the above structures and methods mentioned wherein.

Figure 18:
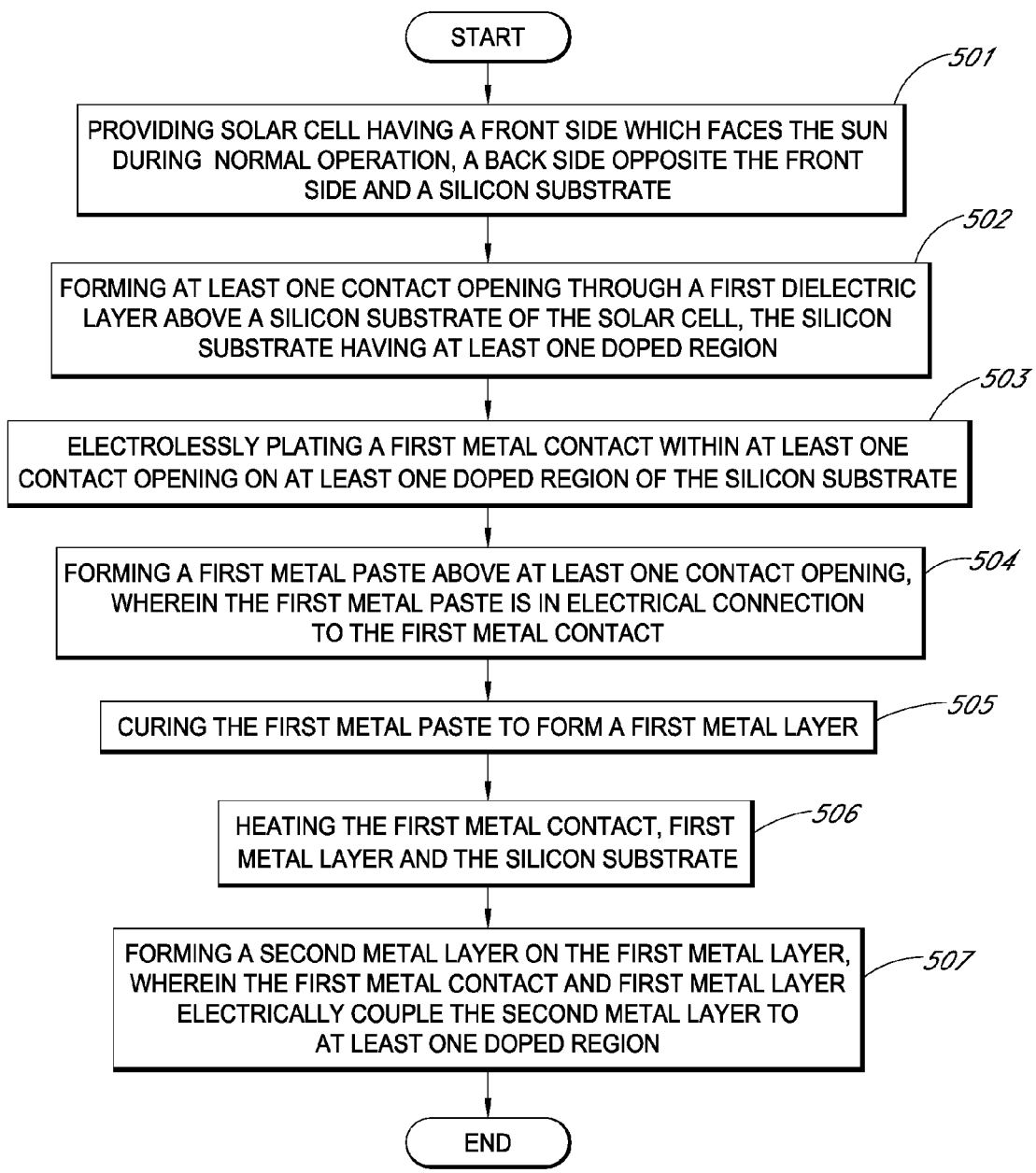
FIGS. 18-20 illustrate flow chart representations of various example methods for forming contact regions of a solar cell, according to some embodiments.

FIG. 18 illustrates a flow chart of an embodiment for an example method for forming a contact region on a solar cell.

At 501, the method can include providing a solar cell having a front side which faces the sun during normal operation, a back side opposite the front side and a silicon substrate.

At 502, at least one contact opening can be formed through a first dielectric layer above a silicon substrate of the solar cell, where the silicon substrate can include at least one doped region.

At 503, a first metal contact can be electrolessly plated within at least one contact opening on at least one doped region of the silicon substrate.

At 504, a first metal paste can be deposited above at least one contact opening, where the first metal paste in in electrical connection to the first metal contact. In an embodiment, the first metal paste can be formed by screen printing.

At 505, the first metal paste can be cured to form a first metal layer.

At 506, the first metal contact, first metal layer and the silicon substrate can be heated.

At 507, a second metal layer can be formed on the first metal layer where the first metal contact and the first metal layer electrically couple the second metal layer to the at least one doped region.

Figure 19:
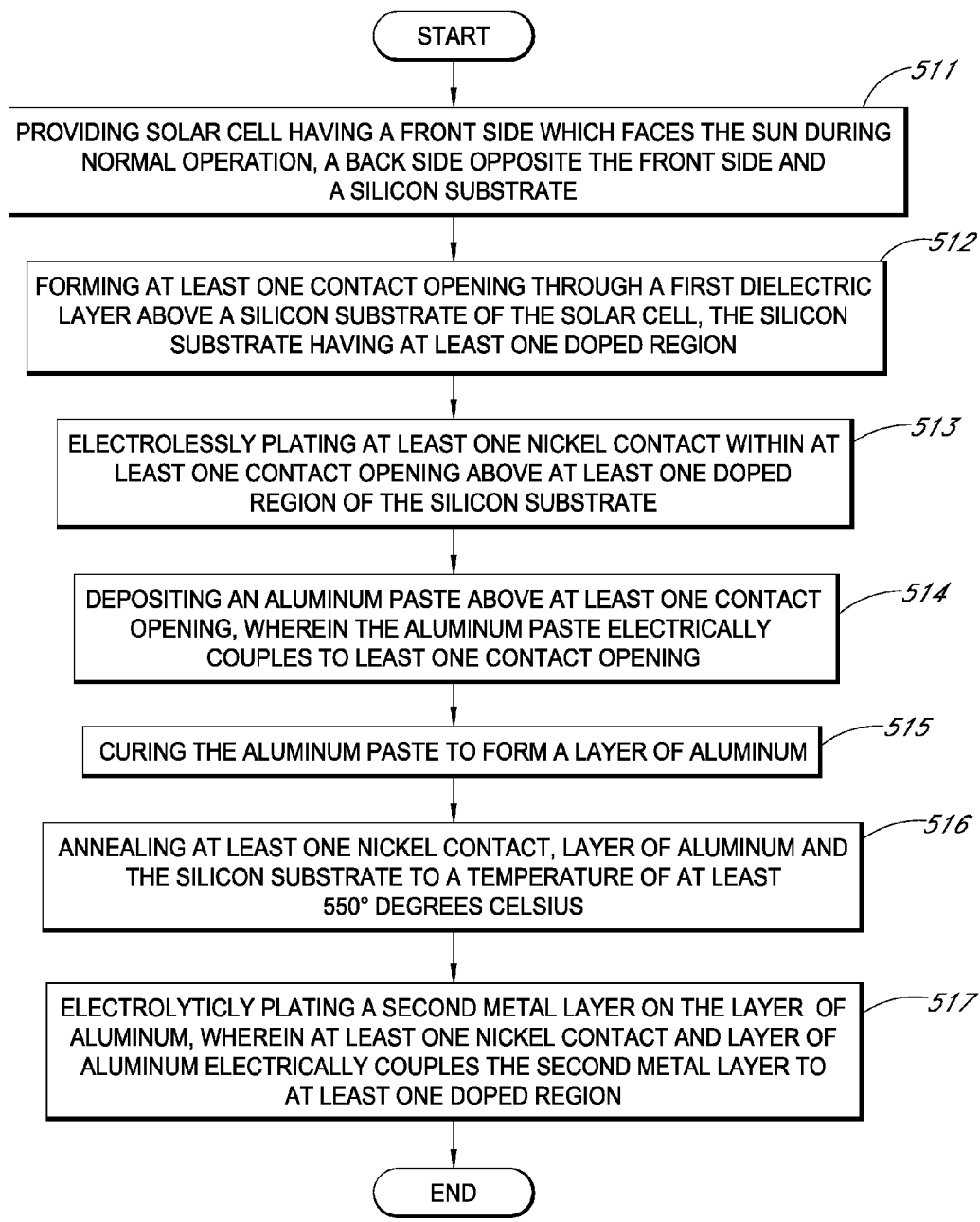

With reference to FIG. 19, flow chart illustrating another example method for forming a contact region on a solar cell is shown.

At 511, the method can include providing a solar cell having a front side which faces the sun during normal operation, a back side opposite the front side and a silicon substrate.

At 512, at least one contact opening can be formed through a first dielectric layer above a silicon substrate of the solar cell, the silicon substrate having at least one doped region. In an embodiment, the first metal paste can be formed by screen printing.

At 513, at least one nickel contact can be electrolessly plated within at least one contact opening above at least one doped region of the silicon substrate.

At 514, an aluminum paste can be deposited above, or over, at least one contact opening, where the aluminum paste electrically couples to at least one contact opening.

At 515, the aluminum paste can be cured to form a layer of aluminum.

At 516, at least one nickel contact, layer of aluminum and silicon substrate can be annealed to a temperature of at least 550° C.

At 517, a second metal layer can be electrolyticly plated on the layer of aluminum, where at least one nickel contact and layer of aluminum electrically couples the second metal layer to at least one doped region.

Figure 20:
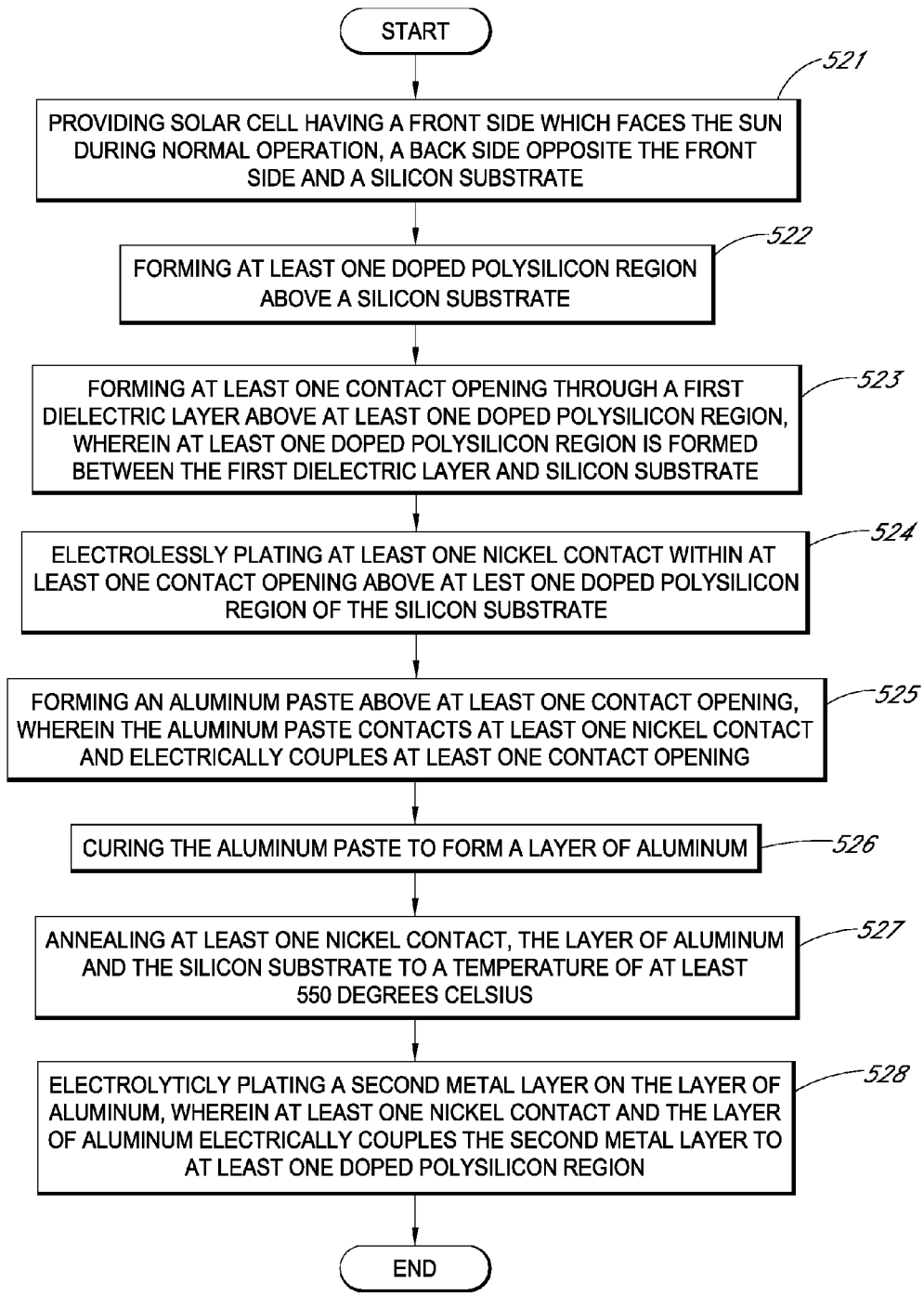

FIG. 20 illustrates still another example method for forming a contact region on a solar cell.

At 521, a solar cell having a front side which faces the sun during normal operation, a back side opposite the front side and a silicon substrate.

At 522, at least one doped polysilicon region can be formed above, or over, a silicon substrate.

At 523, at least one contact opening through a first dielectric layer above, or over, at least one doped polysilicon region, where at least one doped polysilicon region is formed between the first dielectric layer and silicon substrate. In an embodiment, the first metal paste can be formed by screen printing.

At 524, at least one nickel contact can be electrolessly plated within at least one contact opening above, or over, at least one doped polysilicon region of the silicon substrate.

At 525, an aluminum paste can be formed above at least one contact opening, where the aluminum paste contacts at least one nickel contact and electrically couples at least one contact opening.

At 526, the aluminum paste can be cured to form a layer of aluminum.

At 527, at least one nickel contact, layer of aluminum and the silicon substrate can be annealed to a temperature of at least 550° C.

At 528, a second metal layer can be electrolyticly plated on the layer of aluminum, where at least one nickel contact and the layer of aluminum electrically couples the second metal layer to at least one doped polysilicon region.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A method for forming a contact region on a solar cell, the solar cell having a front side which faces the sun during normal operation, and a back side opposite the front side, the method comprising:
    forming at least one contact opening through a first dielectric layer and over a silicon substrate of the solar cell, the silicon substrate having at least one doped region;
    electrolessly plating a first metal contact over at least one contact opening;
    forming a first metal paste over the first metal contact, the first metal paste having a thickness of at least 0.5 microns;
    curing the first metal paste to form a first metal layer;
    heating the first metal contact, first metal layer and the silicon substrate to a temperature of at least 550° C.;
    electrolyticaly plating a second metal layer on the first metal layer, wherein the first metal contact and first metal layer electrically couple the second metal layer to at least one doped region; and
    subsequent to electrolyticaly plating the second metal layer on the first metal layer, electrolyticaly plating a third metal layer on the second metal layer.

2. The method of claim 1, wherein forming at least one contact opening comprises performing a method selected from the group consisting of wet-etching and laser ablation.

3. The method of claim 1, wherein electrolessly plating the first metal contact comprises electrolessly plating a metal selected from the group consisting of nickel, gold, silver, rhodium, chromium, zinc, tin and cadmium.

4. The method of claim 1, wherein forming the first metal paste comprises screen printing the first metal paste.

5. The method of claim 1, wherein the forming a first metal paste comprises depositing an aluminum paste.

6. The method of claim 1, wherein heating the first metal contact, first metal layer and the silicon substrate comprises annealing the first metal contact, first metal layer and the silicon substrate.

7. The method of claim 1, wherein electrolyticaly plating the second metal layer comprises electrolyticaly plating a metal selected from the group consisting of copper, tin, aluminum, silver, gold, chromium, iron, nickel, zinc, ruthenium, palladium, and platinum.

8. A method for forming a contact region on a solar cell, the solar cell having a front side which faces the sun during normal operation, and a back side opposite the front side, the method comprising:
    forming at least one contact opening through a first dielectric layer over a silicon substrate of the solar cell, the silicon substrate having at least one doped region;
    electrolessly plating at least one nickel contact over at least one contact opening;
    depositing an aluminum paste above at least one contact opening, the aluminum paste having a thickness of at least 0.5 microns;
    curing the aluminum paste to form a layer of aluminum;
    annealing at least one nickel contact, layer of aluminum and the silicon substrate to a temperature of at least 550° C.;
    electrolyticaly plating a second metal layer on the layer of aluminum, wherein the at least one nickel contact and layer of aluminum electrically couple the second metal layer to at least one doped region; and
    subsequent to electrolyticaly plating the second metal layer on the layer of aluminum, electrolyticaly plating a third metal layer on the second metal layer.

9. The method of claim 8, wherein forming at least one contact opening through the first dielectric layer comprises performing a method selected from the group consisting of wet-etching and laser ablation.

10. The method of claim 8, wherein forming the first metal paste comprises screen printing the first metal paste.

11. The method of claim 8, wherein electrolyticaly plating the second metal layer comprises electrolyticaly plating a metal selected from the group consisting of copper, tin, aluminum, silver, gold, chromium, iron, nickel, zinc, ruthenium, palladium, and platinum.

12. The method of claim 8, wherein the at least one nickel contact, layer of aluminum and first metal layer electrically couple the third metal layer to at least one doped region.

13. A method for forming a contact region on a solar cell, the solar cell having a front side which faces the sun during normal operation, and a back side opposite the front side, the method comprising:

forming at least one contact opening through a first dielectric layer and over a silicon substrate of the solar cell, the silicon substrate having at least one doped region;

electrolessly plating a first metal contact over at least one contact opening;

forming a first metal paste over the first metal contact, wherein forming the first metal paste comprises screen printing the first metal paste, the first metal paste having a thickness of at least 0.5 microns;

curing the first metal paste to form a first metal layer;

heating the first metal contact, first metal layer and the silicon substrate, wherein heating the first metal contact, first metal layer and the silicon substrate comprises annealing the first metal contact, first metal layer and the silicon substrate to a temperature of at least 550° C.;

electrolyticaly plating a second metal layer on the first metal layer, wherein the first metal contact and first metal layer electrically couple the second metal layer to at least one doped region; and subsequent to electrolyticaly plating the second metal layer on the first metal layer, electrolyticaly plating a third metal layer on the second metal layer.

14. The method of claim 13, wherein forming at least one contact opening comprises performing a method selected from the group consisting of wet-etching and laser ablation.

15. The method of claim 13, wherein electrolessly plating the first metal contact comprises electrolessly plating a metal selected from the group consisting of nickel, gold, silver, rhodium, chromium, zinc, tin and cadmium.

* * * * *